(12) United States Patent
Chang et al.

(10) Patent No.: US 12,224,309 B2
(45) Date of Patent: Feb. 11, 2025

(54) CAPACITORS WITH BUILT-IN ELECTRIC FIELDS

(71) Applicant: Intel Corporation, Santa Clara, CA (US)

(72) Inventors: Sou-Chi Chang, Portland, OR (US);
Chia-Ching Lin, Portland, OR (US);
Kaan Oguz, Portland, OR (US);
I-Cheng Tung, Hillsboro, OR (US);
Uygar E. Avci, Portland, OR (US);
Matthew V. Metz, Portland, OR (US);
Ashish Verma Penumatcha, Beaverton, OR (US); Ian A. Young, Portland, OR (US); Arnab Sen Gupta, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 914 days.

(21) Appl. No.: 17/116,315

(22) Filed: Dec. 9, 2020

(65) Prior Publication Data

US 2022/0181433 A1 Jun. 9, 2022

(51) Int. Cl.
*H01L 23/522* (2006.01)
*H01L 49/02* (2006.01)

(52) U.S. Cl.
CPC .......... *H01L 28/60* (2013.01); *H01L 23/5223* (2013.01); *H01L 28/65* (2013.01); *H01L 28/75* (2013.01); *H01L 28/55* (2013.01)

(58) Field of Classification Search
CPC .......... H01L 28/55; H01L 28/56; H01L 28/57; H01L 28/60; H01L 28/65; H01L 28/75; H01L 23/5223
See application file for complete search history.

(56) References Cited

U.S. PATENT DOCUMENTS

| 7,297,999 B1* | 11/2007 | Wang | H10B 53/30 257/306 |
| 2002/0090742 A1* | 7/2002 | Maruyama | H01L 28/56 257/532 |
| 2006/0214205 A1* | 9/2006 | Baniecki | H01G 7/06 257/295 |
| 2008/0199976 A1* | 8/2008 | Yamagata | H10B 53/30 257/E21.664 |

(Continued)

FOREIGN PATENT DOCUMENTS

| KR | 10-2010-0084677 | * | 7/2010 |
| WO | 2020102416 A1 | | 5/2020 |

OTHER PUBLICATIONS

U.S. Appl. No. 16/914,161, filed Jun. 26, 2020, 69 pages.

(Continued)

*Primary Examiner* — Thanhha S Pham
(74) *Attorney, Agent, or Firm* — Akona IP PC (57) ABSTRACT

Disclosed herein are capacitors including built-in electric fields, as well as related devices and assemblies. In some embodiments, a capacitor may include a top electrode region, a bottom electrode region, and a dielectric region between and in contact with the top electrode region and the bottom electrode region, wherein the dielectric region includes a perovskite material, and the top electrode region has a different material structure than the bottom electrode region.

17 Claims, 3 Drawing Sheets

(56) References Cited

U.S. PATENT DOCUMENTS

2014/0183696 A1   7/2014   Rui et al.

OTHER PUBLICATIONS

Extended European Search Report in European Patent Application No. 21194787.4 dated Feb. 7, 2022, 11 pages.
Kotru, S et al "Electrical behavior of Pb0.95La0.05Zr0.54Ti0.46O3 thin film based capacitors : Influence of space charge region", Journal of Applied Physics, American Institute of Physics, vol. 124, No. 3, Jul. 18, 2018, pp. 034101-1 through 034101-8.

* cited by examiner

CAPACITORS WITH BUILT-IN ELECTRIC FIELDS

BACKGROUND

Capacitors are used in many different electronic device designs. In some devices, for example, decoupling capacitors may be part of an integrated circuit (IC) die, a package substrate, and/or a circuit board.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Disclosed herein are capacitors including built-in electric fields, as well as related devices and assemblies. In some embodiments, a capacitor may include a top electrode region, a bottom electrode region, and a dielectric region between and in contact with the top electrode region and the bottom electrode region, wherein the dielectric region includes a perovskite material, and the top electrode region has a different material structure than the bottom electrode region.

The capacitors disclosed herein may achieve a higher capacitance density than is achievable by conventional capacitors by including a built-in electric field across a polar dielectric (e.g., a perovskite oxide) to shift the maximum of the voltage-dependent capacitance density of polar dielectric capacitors to a target voltage range. In some embodiments, for example, the capacitors disclosed herein may achieve a capacitance density that is significantly greater than the capacitance density of existing capacitors in the absolute value voltage range between 0.5 volts and 1.9 volts. The capacitors disclosed herein may be fabricated under back-end processing conditions (e.g., at temperatures less than 400 degrees Celsius), and thus may be readily incorporated in a metallization stack of an integrated circuit (IC) die (e.g., as an on-die metal-insulator-metal (MIM) capacitor). In some embodiments, an on-die MIM capacitor in accordance with any of the embodiments disclosed herein may be used as a decoupling capacitor to stabilize the die's supply voltage (e.g., by mitigating voltage droop during load switching); such an on-die decoupling capacitor may be used in conjunction with an on-package decoupling capacitor and/or an on-board decoupling capacitor in an IC assembly, as discussed further below.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the subject matter disclosed herein. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. The terms "top" and "bottom" are used herein for ease of illustration, and should not be interpreted to require a necessary orientation unless otherwise specified.

Figure 1:
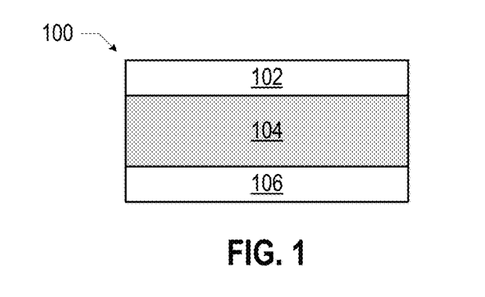
FIGS. 1-4 are side, cross-sectional views of example capacitors with built-in electric fields, in accordance with various embodiments.

FIG. 1 is a side, cross-sectional view of an example capacitor 100 with a built-in electric field, in accordance with various embodiments. The capacitor 100 may include a top electrode 102, a bottom electrode 106, and a dielectric region 104 between the top electrode 102 and the bottom electrode 106. The dielectric region 104 may include a polar dielectric material, such as a perovskite (e.g., a perovskite oxide). In some embodiments, the dielectric region 104 may include strontium. For example, the dielectric region 104 may include strontium, titanium, and oxygen (e.g., in the form of strontium titanate); strontium, barium, titanium, and oxygen (e.g., in the form of strontium barium titanate); or strontium, lead, titanium, and oxygen (e.g., in the form of strontium lead titanate). In some embodiments, the dielectric region 104 may include barium. For example, the dielectric region 104 may include barium, titanium, and oxygen (e.g., in the form of barium titanate); or strontium, barium, titanium, and oxygen (e.g., in the form of strontium barium titanate). In some embodiments, the dielectric region 104 may include bismuth. For example, the dielectric region 104 may include bismuth, iron, and oxygen (e.g., in the form of bismuth ferrite); or lanthanum, bismuth, and oxygen (e.g., in the form of lanthanum bismuth oxide). In some embodiments, the dielectric region 104 may include lanthanum. For example, the dielectric region 104 may include lanthanum, bismuth, and oxygen (e.g., in the form of lanthanum bismuth oxide). In some embodiments, the dielectric region 104 may include lead. For example, the dielectric region 104 may include lead, titanium, and oxygen (e.g., in the form of lead titanate); or strontium, lead, titanium, and oxygen (e.g., in the form of strontium lead titanate). The thickness of the dielectric region 104 may take any suitable value. For example, in some embodiments, the thickness of the dielectric region 104 may be between 4 nanometers and 20 nanometers. In some embodiments, the capacitance density of the capacitors 100 disclosed herein may have a peak in an absolute value range between 0.5 volts and 1.9 volts (i.e., between 0.5 volts and 1.9 volts or between −0.5 volts and −1.9 volts). In some embodiments, the capacitance density of the capacitors 100 disclosed herein may have a peak in an absolute value range between 0.9 volts and 1.9 volts.

In the capacitor 100, the top electrode 102 and/or the bottom electrode 106 may be selected so as to impart a built-in electric field to the capacitor 100. For example, the top electrode 102 and the bottom electrode 106 may have different material structures. As used herein, two materials may have different "material structures" if those materials differ in material composition, crystal phase, defect density, and/or other structural properties that induce an electric field between those materials when the materials are separated by an intervening dielectric material. In some embodiments, as discussed further below, the top electrode 102 and the bottom electrode 106 may each include one or more regions including different materials; consequently, the top electrode 102 and the bottom electrode 106 may be said to have different material structures if at least some regions of the top electrode 102 have a different material structure than at least some regions of the bottom electrode 106. For example, in some embodiments, the top electrode 102 and the bottom electrode 106 may be said to have different material structures when the material of the top electrode 102 that is closest to the dielectric region 104 has a different material structure than the material of the bottom electrode 106 that is closest to the dielectric region 104.

As noted above, in some embodiments, the top electrode 102 and the bottom electrode 106 may have different defect densities that may induce an electric field between them. For example, the difference in the defect density of the top electrode 102 and the defect density of the bottom electrode 106 may be between 1e16 per cubic centimeter and 1e20 per cubic centimeter. Such defect density differences are not likely to arise inadvertently or incidentally during conventional fabrication processes, but are the result of deliberate selection of fabrication conditions and materials to ensure an atypically large defect density difference between the top electrode 102 and the bottom electrode 106. In such an embodiment, the top electrode 102 may take the form of any of the top electrodes 102 discussed below with reference to FIG. 2, and the bottom electrode 106 may take the form of any of the bottom electrodes 106 discussed below with reference to FIG. 3.

Figure 2:
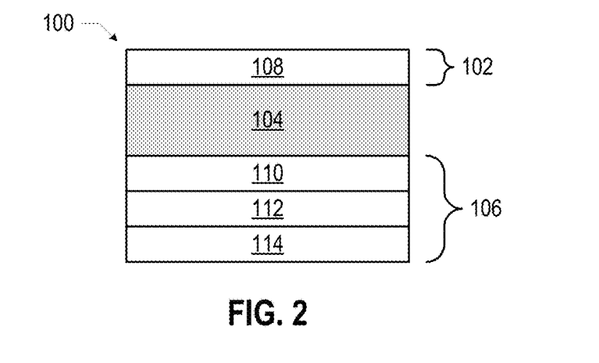

As noted above, in some embodiments, the top electrode 102 and the bottom electrode 106 of a capacitor 100 may have a same material composition, but may have different crystal phases that induce an electric field between them. FIG. 2 is a side, cross-sectional view of an example of such an embodiment. In particular, the top electrode 102 is provided by a material 108, and the bottom electrode 106 is provided by a material 110, a material 112, and a material 114. The material 112 may be between the materials 110 and 114, as shown, and the dielectric region 104 may be between and in contact with the material 108 (of the top electrode 102) and the material 110 (of the bottom electrode 106). In some embodiments, the material 108 and the material 110 may have a same material composition, but may have different phases. For example, the material 108 may be a metal with a face-centered cubic (fcc) structure (e.g., ruthenium metal with an fcc structure), while the material 110 may be the same metal but with a hexagonal close-packed (hcp) structure (e.g., ruthenium metal with an hcp structure), or vice versa. The material 108 and the material 110 may include any suitable materials. In some embodiments, the materials 108 and 110 may include ruthenium, iridium, copper, titanium and nitrogen (e.g., in the form of titanium nitride), titanium, gold, platinum, silver, cobalt, molybdenum, strontium and ruthenium and oxygen (e.g., in the form of strontium ruthenium oxide), iridium and oxygen (e.g., in the form of iridium oxide), ruthenium and oxygen (e.g., in the form of ruthenium oxide), lanthanum and nickel and oxygen (e.g., in the form of lanthanum nickel oxide), or tungsten. The thicknesses of the materials 108 and 110 may take any suitable value. For example, in some embodiments, the thickness of the material 108 may be between 5 nanometers and 50 nanometers, and the thickness of the material 110 may be between 5 nanometers and 50 nanometers.

The material 112 of the bottom electrode 106 of the capacitor 100 of FIG. 2 may have a different material structure (e.g., a different material composition) than the material 110. The material 112 may include ruthenium, iridium, strontium and ruthenium and oxygen (e.g., in the form of strontium ruthenium oxide), iridium and oxygen (e.g., in the form of iridium oxide), ruthenium and oxygen (e.g., in the form of ruthenium oxide), tantalum, copper, titanium and nitrogen (e.g., in the form of titanium nitride), titanium, gold, platinum, silver, cobalt, molybdenum, or tungsten. The thickness of the material 112 may take any suitable value. For example, in some embodiments, the thickness of the material 112 may be between 5 nanometers and 50 nanometers.

The material 114 of the bottom electrode 106 of the capacitor 100 of FIG. 2 may have a different material structure (e.g., a different material composition) than the material 112. The material 114 may include ruthenium, iridium, tantalum, copper, titanium and nitrogen (e.g., in the form of titanium nitride), titanium, gold, platinum, silver, cobalt, molybdenum, or tungsten. The thickness of the material 114 may take any suitable value. For example, in some embodiments, the thickness of the material 114 may be between 0.5 nanometers and 10 nanometers.

Figure 3:
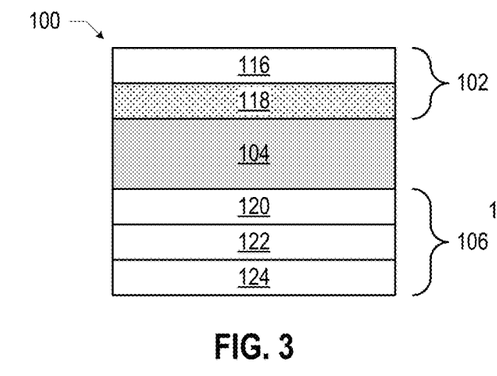
Figure 4:
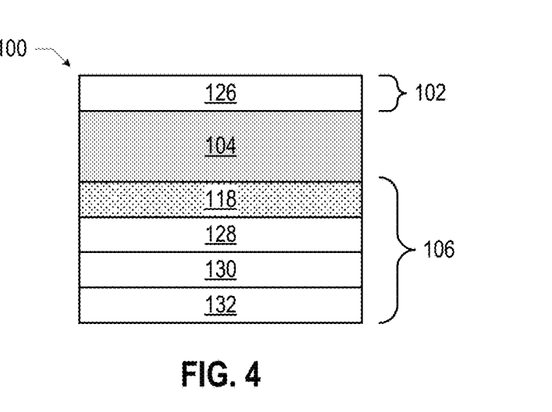

As noted above, in some embodiments, the top electrode 102 and the bottom electrode 106 of a capacitor 100 may have different material compositions that induce an electric field between them. FIGS. 3 and 4 are side, cross-sectional views of examples of such embodiments. In the embodiment of FIG. 3, the top electrode 102 may include a material 116 and a material 118, with the material 118 between and in contact with the material 116 and the dielectric region 104. The material 116 may take the form of any of the materials 108 disclosed herein (e.g., as discussed above with reference to FIG. 2). The material 118 of the capacitor 100 of FIG. 3 may provide a dipole layer at the interface between the material 116 and the dielectric region 104, and thus may create a strong charge difference between the top electrode 102 and the bottom electrode 106 of the capacitor 100 of FIG. 3. In some embodiments, the material 118 may include germanium, lanthanum, hafnium, zirconium, yttrium, barium, bismuth, lead, calcium, magnesium, beryllium, or lithium. In some particular embodiments, the dielectric region 104 may include strontium, titanium, and oxygen (e.g., in the form of strontium titanate) and the material 118 may include lanthanum, hafnium, zirconium, yttrium, barium, bismuth, lead, calcium, magnesium, beryllium, or lithium. The thickness of the material 118 may take any suitable value. For example, in some embodiments, the thickness of the material 118 may be between 0.1 nanometers and 5 nanometers. The bottom electrode 106 of the capacitor 100 of FIG. 3 may include a material 120, a material 124, and a material 122 between the materials 120 and 124. The materials 120, 122, and 124 may take the form of any of the embodiments of the materials 110, 112, and 114, respectively, discussed above with reference to FIG. 2. Further, in some embodiments, the material 120 may include strontium and ruthenium and oxygen (e.g., in the form of strontium ruthenium oxide), iridium and oxygen (e.g., in the form of iridium oxide), or ruthenium and oxygen (e.g., in the form of ruthenium oxide).

In the embodiment of FIG. 4, the bottom electrode 106 may include the material 118. In particular, in the capacitor 100 of FIG. 4, the top electrode 102 may include a material 126. The material 126 may take the form of any of the materials 108 disclosed herein (e.g., as discussed above with reference to FIG. 2). The bottom electrode 106 of the capacitor 100 of FIG. 4 may include a material 128 and a material 118, with the material 118 between and in contact with the material 128 and the dielectric region 104. The bottom electrode 106 of the capacitor 100 of FIG. 4 may also include a material 130 and a material 132, with the material 130 between the materials 128 and 132. The material 118 of the capacitor 100 of FIG. 4 may provide a dipole layer at the interface between the material 116 and the dielectric region 104, and thus may create a strong charge difference between the top electrode 102 and the bottom electrode 106 of the capacitor 100 of FIG. 2. In some embodiments, the material 118 may include germanium, lanthanum, hafnium, zirconium, yttrium, barium, bismuth, lead, calcium, magnesium, beryllium, or lithium. In some particular embodiments, the dielectric region 104 may include strontium, titanium, and oxygen (e.g., in the form of strontium titanate) and the material 118 may include lanthanum, hafnium, zirconium, yttrium, barium, bismuth, lead, calcium, magnesium, beryllium, or lithium. The thickness of the material 118 may take any suitable value. For example, in some embodiments, the thickness of the material 118 may be between 0.1 nanometers and 5 nanometers. The bottom electrode 106 of the capacitor 100 of FIG. 3 may include a material 120, a material 124, and a material 122 between the materials 120 and 124. The materials 120, 122, and 124 may take the form of any of the embodiments of the materials 110, 112, and 114, respectively, discussed above with reference to FIG. 2. Further, in some embodiments, the material 120 may include strontium and ruthenium and oxygen (e.g., in the form of strontium ruthenium oxide), iridium and oxygen (e.g., in the form of iridium oxide), or ruthenium and oxygen (e.g., in the form of ruthenium oxide).

Various ones of the features of the capacitors 100 disclosed herein may be combined in a capacitor 100. For example, a capacitor 100 having a difference in defect density between the top electrode 102 and the bottom electrode 106 (e.g., as discussed above with reference to FIG. 1) may also include a top electrode 102 having a different crystal phase than the bottom electrode 106 (e.g., as discussed above with reference to FIG. 2) and/or may also include a top electrode 102 having a different material composition than the bottom electrode 106 (e.g., as discussed above with reference to FIGS. 3 and 4). Similarly, a capacitor 100 with a top electrode 102 having a different crystal phase than the bottom electrode 106 (e.g., as discussed above with reference to FIG. 2) may also include a top electrode 102 having a different material composition than the bottom electrode 106 (e.g., as discussed above with reference to FIGS. 3 and 4).

The capacitors 100 disclosed herein may be included in any suitable electronic component. FIGS. 5-9 illustrate various examples of apparatuses that may include any of the capacitors 100 disclosed herein.

Figure 5:
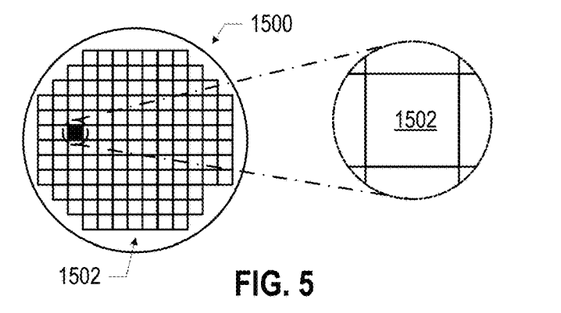
FIG. 5 is a top view of a wafer and dies that may include a capacitor in accordance with any of the embodiments disclosed herein.

FIG. 5 is a top view of a wafer 1500 and dies 1502 that may include one or more capacitors 100 in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more capacitors 100 (e.g., as discussed below with reference to FIG. 6), one or more transistors (e.g., some of the transistors 1640 of FIG. 6, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 9) or other logic that is configured to store information in the memory devices or execute instructions stored in the memory array.

Figure 6:
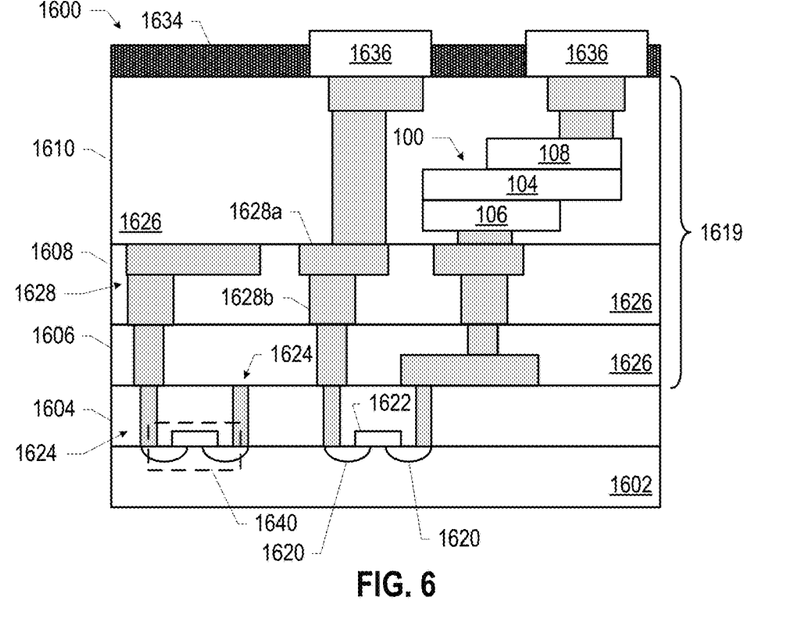
FIG. 6 is a side, cross-sectional view of an integrated circuit (IC) device that may include a capacitor in accordance with any of the embodiments disclosed herein.

FIG. 6 is a side, cross-sectional view of an IC device 1600 that may include one or more capacitors 100 in accordance with any of the embodiments disclosed herein. One or more of the IC devices 1600 may be included in one or more dies 1502 (FIG. 5). The IC device 1600 may be formed on a substrate 1602 (e.g., the wafer 1500 of FIG. 5) and may be included in a die (e.g., the die 1502 of FIG. 5). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device

1600 may be used. The substrate 1602 may be part of a singulated die (e.g., the dies 1502 of FIG. 5) or a wafer (e.g., the wafer 1500 of FIG. 5).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 6 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 6 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. In some embodiments, one or more capacitors 100 may be disposed in one or more of the interconnect layers 1606-1610, in accordance with any of the techniques disclosed herein. FIG. 6 illustrates a single capacitor 100 between metal lines in the interconnect layers 1608 and 1610 for illustration purposes, but any number and arrangement of capacitors 100 may be included in any one or more of the layers in a metallization stack 1619. A capacitor 100 included in the metallization stack 1619 may be referred to as a "back-end" capacitor 100. One or more capacitors 100 in the metallization stack 1619 may be coupled to any suitable ones of the devices in the device layer 1604, and/or to one or more of the conductive contacts 1636 (discussed below).

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 6). Although a particular number of interconnect layers 1606-1610 is depicted in FIG. 6, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 6. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 6. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 6, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 7:
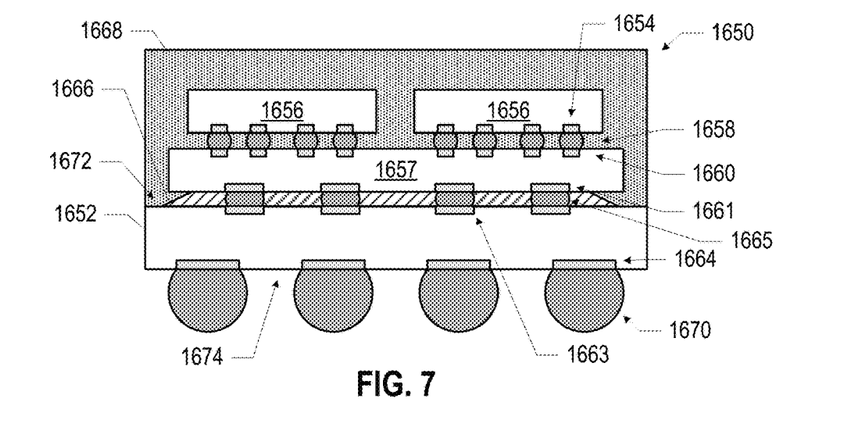
FIG. 7 is a side, cross-sectional view of an IC package that may include a capacitor in accordance with any of the embodiments disclosed herein.

FIG. 7 is a side, cross-sectional view of an example IC package 1650 that may include one or more capacitors 100 in accordance with any of the embodiments disclosed herein. In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnect structures 1628 discussed above with reference to FIG. 6. In some embodiments, the package substrate 1652 may include one or more decoupling capacitors (e.g., surface-mounted to the package substrate 1652 or otherwise coupled to or embedded in the package substrate 1652), in addition to one or more decoupling capacitors 100 in the dies 1656.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to other devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 7 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., a silicon bridge, an organic bridge, one or more waveguides, one or more interposers, wirebonds, etc.).

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 7 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 7 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 8.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory). In some embodiments, the die 1656 may include one or more capacitors 100 (e.g., as discussed above with reference to FIG. 5 and FIG. 6).

Although the IC package 1650 illustrated in FIG. 7 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 7, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 8:
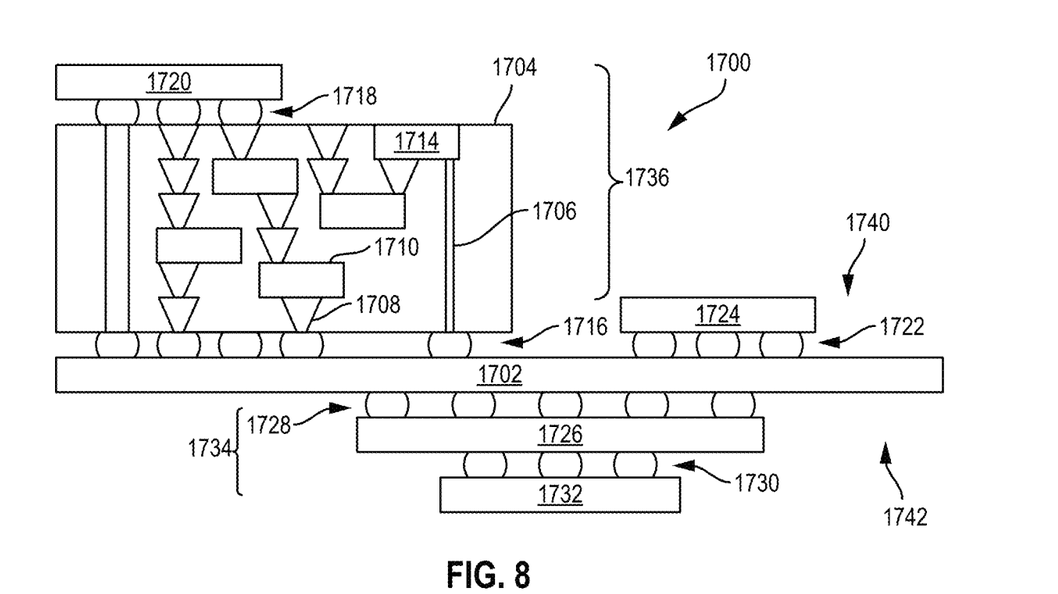
FIG. 8 is a side, cross-sectional view of an IC device assembly that may include a capacitor in accordance with any of the embodiments disclosed herein.

FIG. 8 is a side, cross-sectional view of an IC device assembly 1700 that may include one or more IC packages or other electronic components (e.g., a die) including one or more capacitors 100 in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 7 (e.g., may include one or more capacitors 100 in a die). In some embodiments, the circuit board 1702 may include one or more decoupling capacitors (e.g., surface-mounted to the circuit board 1702 or otherwise coupled to or embedded in the circuit board 1702), in addition to one or more decoupling capacitors 100 in the dies of the IC device assembly 1700 (e.g., as discussed above with reference to FIG. 6) and, in some embodiments, in addition to one or more decoupling capacitors included in the package substrates of the IC device assembly 1700, as discussed above with reference to FIG. 7).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 8 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 8), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 8, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 5), an IC device (e.g., the IC device 1600 of FIG. 6), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 8, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 8 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 9:
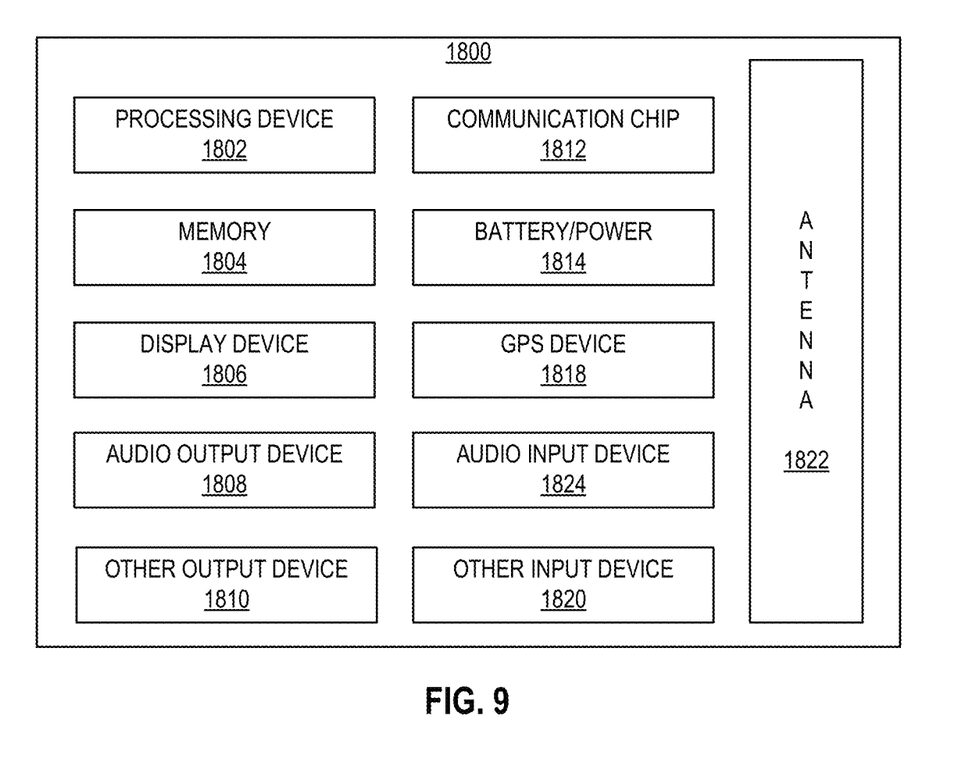
FIG. 9 is a block diagram of an example electrical device that may include a capacitor in accordance with any of the embodiments disclosed herein.

FIG. 9 is a block diagram of an example electrical device 1800 that may include one or more capacitors 100 in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 9 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 9, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein Example 1 is an integrated circuit (IC) die, including a capacitor, wherein the capacitor includes a top electrode region; a bottom electrode region; and a dielectric region between and in contact with the top electrode region and the bottom electrode region; wherein the dielectric region includes a perovskite material, and the top electrode region has a different material structure than the bottom electrode region.

Example 2 includes the subject matter of Example 1, and further specifies that the top electrode region has a different material composition than the bottom electrode region.

Example 3 includes the subject matter of Example 2, and further specifies that the top electrode region includes germanium, lanthanum, hafnium, zirconium, yttrium, barium, lead, calcium, magnesium, beryllium, or lithium.

Example 4 includes the subject matter of Example 3, and further specifies that the top electrode region has a thickness between 0.1 nanometers and 5 nanometers.

Example 5 includes the subject matter of any of Examples 3-4, and further specifies that the top electrode region is a first top electrode region, the capacitor further includes a second top electrode region, the first top electrode region is between the second top electrode region and the dielectric region, and the second top electrode region has a different material composition than the first top electrode region.

Example 6 includes the subject matter of Example 5, and further specifies that the second top electrode region includes ruthenium, iridium, copper, titanium and nitrogen, titanium, gold, platinum, silver, cobalt, molybdenum, or tungsten.

Example 7 includes the subject matter of any of Examples 5-6, and further specifies that the second top electrode region has a thickness between 5 nanometers and 50 nanometers.

Example 8 includes the subject matter of any of Examples 3-7, and further specifies that the bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 9 includes the subject matter of any of Examples 3-8, and further specifies that the bottom electrode region has a thickness between 5 nanometers and 50 nanometers.

Example 10 includes the subject matter of any of Examples 3-9, and further specifies that the bottom electrode region is a first bottom electrode region, and the capacitor further includes a second bottom electrode region, wherein the first bottom electrode region is between the dielectric region and the second bottom electrode region, and the second bottom electrode region has a different material composition than the first bottom electrode region.

Example 11 includes the subject matter of Example 10, and further specifies that the second bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 12 includes the subject matter of any of Examples 10-11, and further specifies that the second bottom electrode region has a thickness between 5 nanometers and 50 nanometers.

Example 13 includes the subject matter of any of Examples 10-12, and further specifies that the capacitor further includes a third bottom electrode region, the second bottom electrode region is between the first bottom electrode region and the third bottom electrode region, and the third bottom electrode region has a different material composition than the second bottom electrode region.

Example 14 includes the subject matter of Example 13, and further specifies that the third bottom electrode region includes tantalum, copper, titanium and nitrogen, titanium, gold, platinum, silver, cobalt, molybdenum, ruthenium, iridium, or tungsten.

Example 15 includes the subject matter of any of Examples 13-14, and further specifies that the third bottom electrode region has a thickness between 0.5 nanometers and 10 nanometers.

Example 16 includes the subject matter of Example 2, and further specifies that the bottom electrode region includes germanium, lanthanum, hafnium, zirconium, yttrium, barium, lead, calcium, magnesium, beryllium, or lithium.

Example 17 includes the subject matter of Example 16, and further specifies that the bottom electrode region has a thickness between 0.1 nanometers and 5 nanometers.

Example 18 includes the subject matter of any of Examples 16-17, and further specifies that the bottom electrode region is a first bottom electrode region, the capacitor further includes a second bottom electrode region, the first bottom electrode region is between the second bottom electrode region and the dielectric region, and the second bottom electrode region has a different material composition than the first bottom electrode region.

Example 19 includes the subject matter of Example 18, and further specifies that the second bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 20 includes the subject matter of any of Examples 18-19, and further specifies that the second bottom electrode region has a thickness between 5 nanometers and 50 nanometers.

Example 21 includes the subject matter of any of Examples 18-20, and further specifies that the capacitor further includes a third bottom electrode region, the second bottom electrode region is between the first bottom electrode region and the third bottom electrode region, and the third bottom electrode region has a different material composition than the second bottom electrode region.

Example 22 includes the subject matter of Example 21, and further specifies that the third bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 23 includes the subject matter of any of Examples 21-22, and further specifies that the third bottom electrode region has a thickness between 5 nanometers and 50 nanometers.

Example 24 includes the subject matter of any of Examples 21-23, and further specifies that the capacitor further includes a fourth bottom electrode region, the third bottom electrode region is between the second bottom electrode region and the fourth bottom electrode region, and the fourth bottom electrode region has a different material composition than the third bottom electrode region.

Example 25 includes the subject matter of Example 24, and further specifies that the fourth bottom electrode region includes tantalum, copper, titanium and nitrogen, titanium, gold, platinum, silver, cobalt, molybdenum, ruthenium, iridium, or tungsten.

Example 26 includes the subject matter of any of Examples 24-25, and further specifies that the fourth bottom electrode region has a thickness between 0.5 nanometers and 10 nanometers.

Example 27 includes the subject matter of Example 1, and further specifies that the top electrode region has a same material composition as the bottom electrode region.

Example 28 includes the subject matter of Example 27, and further specifies that the top electrode region has a different crystal phase than the bottom electrode region.

Example 29 includes the subject matter of any of Examples 27-28, and further specifies that the top electrode region has a crystal phase that is one of face-centered cubic and hexagonal close-packed, and the bottom electrode region has a crystal phase that is an other of face-centered cubic and hexagonal close-packed.

Example 30 includes the subject matter of any of Examples 27-29, and further specifies that the top electrode region has a different defect density than the bottom electrode region.

Example 31 includes the subject matter of Example 30, and further specifies that a difference in defect density between the top electrode region and the bottom electrode region is between 1e16 defects per cubic centimeter and 1e20 defects per cubic centimeter.

Example 32 includes the subject matter of any of Examples 30-31, and further specifies that the top electrode region includes ruthenium, iridium, copper, titanium and nitrogen, titanium, gold, platinum, silver, cobalt, molybdenum, or tungsten.

Example 33 includes the subject matter of any of Examples 30-32, and further specifies that the top electrode region has a thickness between 5 nanometers and 50 nanometers.

Example 34 includes the subject matter of any of Examples 30-33, and further specifies that the bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 35 includes the subject matter of any of Examples 30-34, and further specifies that the bottom electrode region has a thickness between 5 nanometers and 50 nanometers.

Example 36 includes the subject matter of any of Examples 30-35, and further specifies that the bottom electrode region is a first bottom electrode region, and the capacitor further includes a second bottom electrode region, wherein the first bottom electrode region is between the dielectric region and the second bottom electrode region, and the second bottom electrode region has a different material composition than the first bottom electrode region.

Example 37 includes the subject matter of Example 36, and further specifies that the second bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 38 includes the subject matter of any of Examples 36-37, and further specifies that the second bottom electrode region has a thickness between 5 nanometers and 50 nanometers.

Example 39 includes the subject matter of any of Examples 36-38, and further specifies that the capacitor further includes a third bottom electrode region, the second bottom electrode region is between the first bottom electrode region and the third bottom electrode region, and the third bottom electrode region has a different material composition than the second bottom electrode region.

Example 40 includes the subject matter of Example 39, and further specifies that the third bottom electrode region includes tantalum, copper, titanium and nitrogen, titanium, gold, platinum, silver, cobalt, molybdenum, ruthenium, iridium, or tungsten.

Example 41 includes the subject matter of any of Examples 39-40, and further specifies that the third bottom electrode region has a thickness between 0.5 nanometers and 10 nanometers.

Example 42 includes the subject matter of any of Examples 1-41, and further specifies that the capacitor is in a metallization stack of the IC die.

Example 43 includes the subject matter of any of Examples 1-42, and further specifies that the capacitor is a decoupling capacitor.

Example 44 includes the subject matter of any of Examples 1-43, and further specifies that the perovskite material includes strontium, titanium, and oxygen; barium, titanium, and oxygen; strontium, barium, titanium, and oxygen; bismuth, iron, and oxygen; lanthanum, bismuth, and oxygen; lead, titanium, and oxygen; or strontium, lead, titanium, and oxygen.

Example 45 includes the subject matter of any of Examples 1-44, and further specifies that the dielectric region has a thickness between 4 nanometers and 20 nanometers.

Example 46 is an integrated circuit (IC) die, including: a capacitor, wherein the capacitor includes a top electrode region, a bottom electrode region, and a dielectric region between and in contact with the top electrode region and the bottom electrode region, wherein the dielectric region includes a polar dielectric material, and the top electrode region has a different material structure than the bottom electrode region.

Example 47 includes the subject matter of Example 46, and further specifies that the top electrode region has a different material composition than the bottom electrode region.

Example 48 includes the subject matter of Example 47, and further specifies that the top electrode region includes germanium, lanthanum, hafnium, zirconium, yttrium, barium, lead, calcium, magnesium, beryllium, or lithium.

Example 49 includes the subject matter of Example 48, and further specifies that the top electrode region has a thickness between 0.1 nanometers and 5 nanometers.

Example 50 includes the subject matter of any of Examples 48-49, and further specifies that the top electrode region is a first top electrode region, the capacitor further includes a second top electrode region, the first top electrode region is between the second top electrode region and the dielectric region, and the second top electrode region has a different material composition than the first top electrode region.

Example 51 includes the subject matter of Example 50, and further specifies that the second top electrode region includes ruthenium, iridium, copper, titanium and nitrogen, titanium, gold, platinum, silver, cobalt, molybdenum, or tungsten.

Example 52 includes the subject matter of any of Examples 50-51, and further specifies that the second top electrode region has a thickness between 5 nanometers and 50 nanometers.

Example 53 includes the subject matter of any of Examples 48-52, and further specifies that the bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 54 includes the subject matter of any of Examples 48-53, and further specifies that the bottom electrode region has a thickness between 5 nanometers and 50 nanometers.

Example 55 includes the subject matter of any of Examples 48-54, and further specifies that the bottom electrode region is a first bottom electrode region, and the capacitor further includes a second bottom electrode region, wherein the first bottom electrode region is between the dielectric region and the second bottom electrode region, and the second bottom electrode region has a different material composition than the first bottom electrode region.

Example 56 includes the subject matter of Example 55, and further specifies that the second bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 57 includes the subject matter of any of Examples 55-56, and further specifies that the second bottom electrode region has a thickness between 5 nanometers and 50 nanometers.

Example 58 includes the subject matter of any of Examples 55-57, and further specifies that the capacitor further includes a third bottom electrode region, the second bottom electrode region is between the first bottom electrode region and the third bottom electrode region, and the third bottom electrode region has a different material composition than the second bottom electrode region.

Example 59 includes the subject matter of Example 58, and further specifies that the third bottom electrode region includes tantalum, copper, titanium and nitrogen, titanium, gold, platinum, silver, cobalt, molybdenum, ruthenium, iridium, or tungsten.

Example 60 includes the subject matter of any of Examples 58-59, and further specifies that the third bottom electrode region has a thickness between 0.5 nanometers and 10 nanometers.

Example 61 includes the subject matter of Example 47, and further specifies that the bottom electrode region includes germanium, lanthanum, hafnium, zirconium, yttrium, barium, lead, calcium, magnesium, beryllium, or lithium.

Example 62 includes the subject matter of Example 61, and further specifies that the bottom electrode region has a thickness between 0.1 nanometers and 5 nanometers.

Example 63 includes the subject matter of any of Examples 61-62, and further specifies that the bottom electrode region is a first bottom electrode region, the capacitor further includes a second bottom electrode region, the first bottom electrode region is between the second bottom electrode region and the dielectric region, and the second bottom electrode region has a different material composition than the first bottom electrode region.

Example 64 includes the subject matter of Example 63, and further specifies that the second bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 65 includes the subject matter of any of Examples 63-64, and further specifies that the second bottom electrode region has a thickness between 5 nanometers and 50 nanometers.

Example 66 includes the subject matter of any of Examples 63-65, and further specifies that the capacitor further includes a third bottom electrode region, the second bottom electrode region is between the first bottom electrode region and the third bottom electrode region, and the third bottom electrode region has a different material composition than the second bottom electrode region.

Example 67 includes the subject matter of Example 66, and further specifies that the third bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 68 includes the subject matter of any of Examples 66-67, and further specifies that the third bottom electrode region has a thickness between 5 nanometers and 50 nanometers.

Example 69 includes the subject matter of any of Examples 66-68, and further specifies that the capacitor further includes a fourth bottom electrode region, the third bottom electrode region is between the second bottom electrode region and the fourth bottom electrode region, and the fourth bottom electrode region has a different material composition than the third bottom electrode region.

Example 70 includes the subject matter of Example 69, and further specifies that the fourth bottom electrode region includes tantalum, copper, titanium and nitrogen, titanium, gold, platinum, silver, cobalt, molybdenum, ruthenium, iridium, or tungsten.

Example 71 includes the subject matter of any of Examples 69-70, and further specifies that the fourth bottom electrode region has a thickness between 0.5 nanometers and 10 nanometers.

Example 72 includes the subject matter of Example 46, and further specifies that the top electrode region has a same material composition as the bottom electrode region.

Example 73 includes the subject matter of any of Examples 72, and further specifies that the top electrode region has a different crystal phase than the bottom electrode region.

Example 74 includes the subject matter of any of Examples 72-73, and further specifies that the top electrode region has a crystal phase that is one of face-centered cubic and hexagonal close-packed, and the bottom electrode region has a crystal phase that is an other of face-centered cubic and hexagonal close-packed.

Example 75 includes the subject matter of any of Examples 72-74, and further specifies that the top electrode region has a different defect density than the bottom electrode region.

Example 76 includes the subject matter of Example 75, and further specifies that a difference in defect density between the top electrode region and the bottom electrode region is between 1e16 defects per cubic centimeter and 1e20 defects per cubic centimeter.

Example 77 includes the subject matter of any of Examples 75-76, and further specifies that the top electrode region includes ruthenium, iridium, copper, titanium and nitrogen, titanium, gold, platinum, silver, cobalt, molybdenum, or tungsten.

Example 78 includes the subject matter of any of Examples 75-77, and further specifies that the top electrode region has a thickness between 5 nanometers and 50 nanometers.

Example 79 includes the subject matter of any of Examples 75-78, and further specifies that the bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 80 includes the subject matter of any of Examples 75-79, and further specifies that the bottom electrode region has a thickness between 5 nanometers and 50 nanometers.

Example 81 includes the subject matter of any of Examples 75-80, and further specifies that the bottom electrode region is a first bottom electrode region, and the capacitor further includes a second bottom electrode region, wherein the first bottom electrode region is between the dielectric region and the second bottom electrode region, and the second bottom electrode region has a different material composition than the first bottom electrode region.

Example 82 includes the subject matter of Example 81, and further specifies that the second bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 83 includes the subject matter of any of Examples 81-82, and further specifies that the second bottom electrode region has a thickness between 5 nanometers and 50 nanometers.

Example 84 includes the subject matter of any of Examples 81-83, and further specifies that the capacitor further includes a third bottom electrode region, the second bottom electrode region is between the first bottom electrode region and the third bottom electrode region, and the third bottom electrode region has a different material composition than the second bottom electrode region.

Example 85 includes the subject matter of Example 84, and further specifies that the third bottom electrode region includes tantalum, copper, titanium and nitrogen, titanium, gold, platinum, silver, cobalt, molybdenum, ruthenium, iridium, or tungsten.

Example 86 includes the subject matter of any of Examples 84-85, and further specifies that the third bottom electrode region has a thickness between 0.5 nanometers and 10 nanometers.

Example 87 includes the subject matter of any of Examples 46-86, and further specifies that the capacitor is in a metallization stack of the IC die.

Example 88 includes the subject matter of any of Examples 46-87, and further specifies that the capacitor is between a topmost metal layer and a second topmost metal layer of the metallization stack.

Example 89 includes the subject matter of any of Examples 46-88, and further specifies that the capacitor is a decoupling capacitor.

Example 90 includes the subject matter of any of Examples 46-89, and further specifies that the polar dielectric material includes strontium, barium, bismuth, or lead.

Example 91 includes the subject matter of any of Examples 46-90, and further specifies that the polar dielectric material is a perovskite material.

Example 92 includes the subject matter of any of Examples 46-91, and further specifies that the polar dielectric material includes strontium, titanium, and oxygen; barium, titanium, and oxygen; strontium, barium, titanium, and oxygen; bismuth, iron, and oxygen; lanthanum, bismuth, and oxygen; lead, titanium, and oxygen; or strontium, lead, titanium, and oxygen.

Example 93 includes the subject matter of any of Examples 46-92, and further specifies that the dielectric region has a thickness between 4 nanometers and 20 nanometers.

Example 94 is an integrated circuit (IC) die, including: a capacitor, wherein the capacitor includes a top electrode region, a bottom electrode region, and a dielectric region between and in contact with the top electrode region and the bottom electrode region, wherein the dielectric region includes strontium, barium, bismuth, or lead, and the top electrode region has a different material structure than the bottom electrode region.

Example 95 includes the subject matter of Example 94, and further specifies that the top electrode region has a different material composition than the bottom electrode region.

Example 96 includes the subject matter of Example 95, and further specifies that the top electrode region includes germanium, lanthanum, hafnium, zirconium, yttrium, barium, lead, calcium, magnesium, beryllium, or lithium.

Example 97 includes the subject matter of any of Examples 96, and further specifies that the top electrode region has a thickness between 0.1 nanometers and 5 nanometers.

Example 98 includes the subject matter of any of Examples 96-97, and further specifies that the top electrode region is a first top electrode region, the capacitor further includes a second top electrode region, the first top electrode region is between the second top electrode region and the dielectric region, and the second top electrode region has a different material composition than the first top electrode region.

Example 99 includes the subject matter of Example 98, and further specifies that the second top electrode region includes ruthenium, iridium, copper, titanium and nitrogen, titanium, gold, platinum, silver, cobalt, molybdenum, or tungsten.

Example 100 includes the subject matter of any of Examples 98-99, and further specifies that the second top electrode region has a thickness between 5 nanometers and 50 nanometers.

Example 101 includes the subject matter of any of Examples 96-100, and further specifies that the bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 102 includes the subject matter of any of Examples 96-101, and further specifies that the bottom electrode region has a thickness between 5 nanometers and 50 nanometers.

Example 103 includes the subject matter of any of Examples 96-102, and further specifies that the bottom electrode region is a first bottom electrode region, and the capacitor further includes a second bottom electrode region, wherein the first bottom electrode region is between the dielectric region and the second bottom electrode region, and the second bottom electrode region has a different material composition than the first bottom electrode region.

Example 104 includes the subject matter of Example 103, and further specifies that the second bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 105 includes the subject matter of any of Examples 103-104, and further specifies that the second bottom electrode region has a thickness between 5 nanometers and 50 nanometers.

Example 106 includes the subject matter of any of Examples 103-105, and further specifies that the capacitor further includes a third bottom electrode region, the second bottom electrode region is between the first bottom electrode region and the third bottom electrode region, and the third bottom electrode region has a different material composition than the second bottom electrode region.

Example 107 includes the subject matter of Example 106, and further specifies that the third bottom electrode region includes tantalum, copper, titanium and nitrogen, titanium, gold, platinum, silver, cobalt, molybdenum, ruthenium, iridium, or tungsten.

Example 108 includes the subject matter of any of Examples 106-107, and further specifies that the third bottom electrode region has a thickness between 0.5 nanometers and 10 nanometers.

Example 109 includes the subject matter of Example 94, and further specifies that the bottom electrode region includes germanium, lanthanum, hafnium, zirconium, yttrium, barium, lead, calcium, magnesium, beryllium, or lithium.

Example 110 includes the subject matter of Example 109, and further specifies that the bottom electrode region has a thickness between 0.1 nanometers and 5 nanometers.

Example 111 includes the subject matter of any of Examples 109-110, and further specifies that the bottom electrode region is a first bottom electrode region, the capacitor further includes a second bottom electrode region, the first bottom electrode region is between the second bottom electrode region and the dielectric region, and the second bottom electrode region has a different material composition than the first bottom electrode region.

Example 112 includes the subject matter of Example 111, and further specifies that the second bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 113 includes the subject matter of any of Examples 111-112, and further specifies that the second bottom electrode region has a thickness between 5 nanometers and 50 nanometers.

Example 114 includes the subject matter of any of Examples 111-113, and further specifies that the capacitor further includes a third bottom electrode region, the second bottom electrode region is between the first bottom electrode region and the third bottom electrode region, and the third bottom electrode region has a different material composition than the second bottom electrode region.

Example 115 includes the subject matter of Example 114, and further specifies that the third bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 116 includes the subject matter of any of Examples 114-115, and further specifies that the third bottom electrode region has a thickness between 5 nanometers and 50 nanometers.

Example 117 includes the subject matter of any of Examples 114-116, and further specifies that the capacitor further includes a fourth bottom electrode region, the third bottom electrode region is between the second bottom electrode region and the fourth bottom electrode region, and the fourth bottom electrode region has a different material composition than the third bottom electrode region.

Example 118 includes the subject matter of Example 117, and further specifies that the fourth bottom electrode region includes tantalum, copper, titanium and nitrogen, titanium, gold, platinum, silver, cobalt, molybdenum, ruthenium, iridium, or tungsten.

Example 119 includes the subject matter of any of Examples 117-118, and further specifies that the fourth bottom electrode region has a thickness between 0.5 nanometers and 10 nanometers.

Example 120 includes the subject matter of Example 93, and further specifies that the top electrode region has a same material composition as the bottom electrode region.

Example 121 includes the subject matter of Example 120, and further specifies that the top electrode region has a different crystal phase than the bottom electrode region.

Example 122 includes the subject matter of any of Examples 120-121, and further specifies that the top electrode region has a crystal phase that is one of face-centered cubic and hexagonal close-packed, and the bottom electrode region has a crystal phase that is an other of face-centered cubic and hexagonal close-packed.

Example 123 includes the subject matter of any of Examples 120-122, and further specifies that the top electrode region has a different defect density than the bottom electrode region.

Example 124 includes the subject matter of Example 123, and further specifies that a difference in defect density between the top electrode region and the bottom electrode region is between 1e16 defects per cubic centimeter and 1e20 defects per cubic centimeter.

Example 125 includes the subject matter of any of Examples 123-124, and further specifies that the top electrode region includes ruthenium, iridium, copper, titanium and nitrogen, titanium, gold, platinum, silver, cobalt, molybdenum, or tungsten.

Example 126 includes the subject matter of any of Examples 123-125, and further specifies that the top electrode region has a thickness between 5 nanometers and 50 nanometers.

Example 127 includes the subject matter of any of Examples 123-126, and further specifies that the bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 128 includes the subject matter of any of Examples 123-127, and further specifies that the bottom electrode region has a thickness between 5 nanometers and 50 nanometers.

Example 129 includes the subject matter of any of Examples 123-128, and further specifies that the bottom electrode region is a first bottom electrode region, and the capacitor further includes a second bottom electrode region, wherein the first bottom electrode region is between the dielectric region and the second bottom electrode region, and the second bottom electrode region has a different material composition than the first bottom electrode region.

Example 130 includes the subject matter of Example 129, and further specifies that the second bottom electrode region includes ruthenium, iridium, strontium and ruthenium and oxygen, iridium and oxygen, ruthenium and oxygen, tantalum, copper, titanium and nitrogen, titanium, gold, platinum, silver, cobalt, molybdenum, or tungsten.

Example 131 includes the subject matter of any of Examples 129-130, and further specifies that the second bottom electrode region has a thickness between 5 nanometers and 50 nanometers.

Example 132 includes the subject matter of any of Examples 129-131, and further specifies that the capacitor further includes a third bottom electrode region, the second bottom electrode region is between the first bottom electrode region and the third bottom electrode region, and the third bottom electrode region has a different material composition than the second bottom electrode region.

Example 133 includes the subject matter of Example 132, and further specifies that the third bottom electrode region includes tantalum, copper, titanium and nitrogen, titanium, gold, platinum, silver, cobalt, molybdenum, ruthenium, iridium, or tungsten.

Example 134 includes the subject matter of any of Examples 132-133, and further specifies that the third bottom electrode region has a thickness between 0.5 nanometers and 10 nanometers.

Example 135 includes the subject matter of any of Examples 94-134, and further specifies that the capacitor is in a metallization stack of the IC die.

Example 136 includes the subject matter of any of Examples 94-135, and further specifies that the capacitor is between a topmost metal layer and a second topmost metal layer of the metallization stack.

Example 137 includes the subject matter of any of Examples 94-136, and further specifies that the capacitor is a decoupling capacitor.

Example 138 includes the subject matter of any of Examples 94-137, and further specifies that the dielectric region includes a perovskite material.

Example 139 includes the subject matter of any of Examples 94-138, and further specifies that the dielectric region includes strontium, titanium, and oxygen; barium, titanium, and oxygen; strontium, barium, titanium, and oxygen; bismuth, iron, and oxygen; lanthanum, bismuth, and oxygen; lead, titanium, and oxygen; or strontium, lead, titanium, and oxygen.

Example 140 includes the subject matter of any of Examples 94-139, and further specifies that the dielectric region has a thickness between 4 nanometers and 20 nanometers.

Example 141 is an integrated circuit (IC) assembly, including: an IC die, wherein the IC die is the IC die of any of Examples 1-140; and a support coupled to the IC die.

Example 142 includes the subject matter of Example 141, and further specifies that the support includes a package substrate.

Example 143 includes the subject matter of any of Examples 141-142, and further specifies that the support includes a circuit board.

Example 144 includes the subject matter of any of Examples 143, and further specifies that the circuit board is a motherboard.

Example 145 includes the subject matter of any of Examples 141-144, and further specifies that the support includes a housing.

Example 146 includes the subject matter of any of Examples 141-145, and further specifies that the IC assembly is a handheld computing device.

Example 147 includes the subject matter of any of Examples 141-145, and further specifies that the IC assembly is a server computing device.

Example 148 includes the subject matter of any of Examples 141-145, and further specifies that the IC assembly is a laptop computing device.

The invention claimed is:

1. An integrated circuit (IC) die, comprising:
a capacitor, including:
a top electrode comprising a first top electrode region and a second top electrode region wherein the first top electrode region has a different material composition than the first top electrode region;
a bottom electrode; and
a dielectric region between and in contact with the first top electrode region and the bottom electrode;
wherein the dielectric region includes a perovskite material, the first top electrode region has a same material composition as the bottom electrode, and the first top electrode region has at least one of a different crystal phase from the bottom electrode and a different defect density from the bottom electrode.

2. The IC die of claim 1, wherein the first top electrode region has a different material composition than the bottom electrode.

3. The IC die of claim 2, wherein the first top electrode region includes germanium, lanthanum, hafnium, zirconium, yttrium, barium, lead, calcium, magnesium, beryllium, or lithium.

4. The IC die of claim 3, wherein the first top electrode region has a thickness between 0.1 nanometers and 5 nanometers.

5. The IC die of claim 1, wherein the second top electrode region includes ruthenium, iridium, copper, titanium and nitrogen, titanium, gold, platinum, silver, cobalt, molybdenum, or tungsten.

6. The IC die of claim 1, wherein the second top electrode region has a thickness between 5 nanometers and 50 nanometers.

7. The IC die of claim 1, wherein the first top electrode region has a different crystal phase from the bottom electrode.

8. The IC die of claim 1, wherein the first top electrode region has a different defect density from the bottom electrode.

9. The IC die of claim 1, wherein the capacitor is in a metallization stack of the IC die.

10. The IC die of claim 1, wherein a difference in defect density between the first top electrode region and the bottom electrode is between 1e16 defects per cubic centimeter and 1e20 defects per cubic centimeter.

11. An integrated circuit (IC) die, comprising:
a capacitor, wherein the capacitor includes a top electrode and, a bottom electrode comprising a first bottom electrode region and a second bottom electrode region, wherein the second bottom electrode region has a different material composition than the first bottom electrode; and
a dielectric region between and in contact with the top electrode and the first bottom electrode region, wherein the dielectric region includes a polar dielectric material, the top electrode has a same material composition as the first bottom electrode region, and the top electrode has a different material structure than the first bottom electrode region, the different material structure comprising at least one of a different crystal phase and a different defect density.

12. The IC die of claim 11, wherein the bottom electrode further includes a third bottom electrode region, the second bottom electrode region is between the first bottom electrode region and the third bottom electrode region, and the third bottom electrode region has a different material composition than the second bottom electrode region.

13. The IC die of claim 12, wherein the bottom electrode further includes a fourth bottom electrode region, the third bottom electrode region is between the second bottom electrode region and the fourth bottom electrode region, and the fourth bottom electrode region has a different material composition than the third bottom electrode region.

14. The IC die of claim 11, wherein the capacitor is between a topmost metal layer and a second topmost metal layer of a metallization stack.

15. The IC die of claim 11, wherein the top electrode has a different defect density from the first bottom electrode region, and a difference in defect density between the top electrode and the first bottom electrode region is between 1e16 defects per cubic centimeter and 1e20 defects per cubic centimeter.

16. An integrated circuit (IC) die, comprising:
a capacitor, wherein the capacitor includes a top electrode region, a bottom electrode region, and a dielectric region between and in contact with the top electrode region and the bottom electrode region, wherein the dielectric region includes strontium, barium, bismuth, or lead, and the top electrode region has a different defect density from the bottom electrode region, wherein a difference in defect density between the top electrode region and the bottom electrode region is between 1e16 defects per cubic centimeter and 1e20 defects per cubic centimeter.

17. The IC die of claim 16, wherein the capacitor is a decoupling capacitor.

* * * * *

UNITED STATES PATENT AND TRADEMARK OFFICE
CERTIFICATE OF CORRECTION

PATENT NO. : 12,224,309 B2
APPLICATION NO. : 17/116315
DATED : February 11, 2025
INVENTOR(S) : Sou-Chi Chang et al.

Page 1 of 1

It is certified that error appears in the above-identified patent and that said Letters Patent is hereby corrected as shown below:

In the Claims

In Column 27, Claim 1, Lines 26-28, delete "wherein the first top electrode region has a different material composition than the first top electrode region" and insert -- wherein the first top electrode region has a different material composition than the second top electrode region --, therefor.

In Column 27, Claim 2, Line 38, delete "first" and insert -- second --, therefor.

In Column 28, Claim 11, Lines 13-14, delete "first bottom electrode; and" and insert -- first bottom electrode region; and --, therefor.

Signed and Sealed this
Fifteenth Day of April, 2025

Coke Morgan Stewart
*Acting Director of the United States Patent and Trademark Office*